United States Patent [19]
Kikuiri et al.

[11] Patent Number: 5,299,251
[45] Date of Patent: Mar. 29, 1994

[54] EXPOSURE APPARATUS

[75] Inventors: Nobutaka Kikuiri, Tokyo; Yoriyuki Ishibashi; Takahiro Murata, both of Kanagawa, all of Japan

[73] Assignee: Kabushiki Kaisha Toshiba, Kanagawa, Japan

[21] Appl. No.: 46,928

[22] Filed: Apr. 13, 1993

Related U.S. Application Data

[63] Continuation of Ser. No. 786,746, Nov. 1, 1991, abandoned.

[30] Foreign Application Priority Data

Nov. 5, 1990 [JP] Japan .................................... 2-299442

[51] Int. Cl.$^5$ ............................................. G21K 5/00
[52] U.S. Cl. ..................................... 378/34; 378/206; 250/492.2
[58] Field of Search ................... 378/34, 35, 204, 205, 378/206; 250/491.1, 492.1, 492.2 R, 492.2 A

[56] References Cited

U.S. PATENT DOCUMENTS 4,777,641  10/1988  Inagaki et al. ...................... 378/205

FOREIGN PATENT DOCUMENTS 0358515  3/1990  European Pat. Off. .
63-18623  1/1988  Japan .
2-192112  7/1990  Japan .

*Primary Examiner*—David P. Porta
*Attorney, Agent, or Firm*—Finnegan, Henderson, Farabow, Garrett & Dunner

[57] ABSTRACT

An exposure apparatus for a semiconductor wafer, a liquid crystal display panel and so on. The exposure apparatus comprises a light source, a holding means for a mask and a target, a moving means for moving the holding means and optical alignment systems. The optical alignment system has a moving base on which a detecting means is installed. The moving bases are arranged in the same plane and have narrow portions in their front.

13 Claims, 7 Drawing Sheets

INPUT                              OUTPUT

EXPOSURE APPARATUS

This application is a continuation, of application Ser. No. 07/786,746 filed Nov. 1, 1991, now abandoned.

BACKGROUND OF THE INVENTION

1. Field of the Invention

This invention relates to an exposure apparatus for producing an Ultra Large Scale Integrated Circuit (ULSI), a liquid crystal display panel and so on. In particular, the invention relates to an alignment system to adjust positions of masks and targets to be exposed.

2. Description of the Related Art

Light exposure apparatus have been applied to produce large scale integrated circuits. However, as the patterns of the circuits get finer and finer, it becomes harder to expose such circuit patterns by the light exposure apparatus because of resolution and productivity requirements.

Recently X-ray exposure apparatus have been developed instead of light exposure apparatus because the X-ray exposure apparatus can transfer finer circuit patterns than can light exposure apparatus.

In the case of such exposure by the X-ray apparatus, it is very difficult to transfer reduced patterns from a mask to a target such as a semiconductor wafer. Therefore, the patterns have to be transferred isometrically in an exposure process. In the case of isometric exposure, the gap between the mask and the wafer should have a minimum space of 10–50 μm. Such exposure is called a proximity exposure.

A general X-ray exposure apparatus used to expose a semiconductor wafer is shown in FIG. 1. FIG. 1 is a schematic vertical sectional view.

In FIG. 1 X-ray 51 from syncrotron orbital radiation (SOR) is reflected on an X-ray reflect mirror (not shown) and passes through a port 52 kept in high vacuum pressure. After that, the X-ray passes through a window 53 and a bellow 54, then into a chamber 55. In the chamber 55 there re alignment systems 58 which detect the positions and distance between the X-ray mask 56 and the semiconductor wafer 60 by LASER beam 61 as a detecting beam. Behind the chamber 55 there is a mask stage 57 which holds and moves a X-ray mask 56 and a wafer stage 59 which holds and moves a semiconductor wafer 60.

In this structure, the X-ray 51 passing through the window 53 into the chamber 55 is exposed on the X-ray mask 56 and transfers patterns on the X-ray mask to the semiconductor wafer 60 which is spaced apart from the X-ray mask by dozens of μm.

The exposure process as described above is repeated several times. Therefore, the positions and the distance between the X-ray mask 56 and the semiconductor wafer 60 must be detected in each exposure process and be adjusted to the right position precisely. The alignment system 58 is applied to the detection described above.

A conventional structure of such alignment systems are shown in FIG. 2 and FIG. 3.

Alignment marks are written on both an X-ray mask and a semiconductor wafer. The alignment system takes the picture data of these alignment marks and gets the information about the relative distance between the mask and the wafer by the processing of the picture data.

An explanation of the alignment marks written on the X-ray mask is described hereunder.

Three alignment marks (X mark 6a, Y mark 6b, θ mark 6c shown in FIG. 2 and FIG. 3) are written on an exposed area in the X-ray mask 6. Three optical alignment systems are installed in the alignment systems, the optical alignment system 11a for detecting the X mark position, the optical alignment system 11b for detecting the Y mark position and the optical alignment system 11c for detecting the θ mark position.

As shown in FIG. 2 and FIG. 3, these optical alignment systems 11a, 11b, 11c, comprise objective lenses (12a, 12b, 12c), three prisms (13a, 13b, 13c), and half mirrors and reflective mirrors (not shown in FIG. 2 and FIG. 3).

A detection beam passes through the half mirror and the objective lens and goes to the prism. The path of the beam is bent 90 degrees by the prism. After reflection by the prism the beam reaches the alignment mark. Then, the beam is reflected by the alignment mark and passes back the same way, i.e., through the prism and the objective lens. The beam passed through the objective lens reflects on the half mirror and the reflective mirror. The beam reflected on &he reflective mirror is processed as picture data expressing the position of the alignment mark.

The positions of the alignment marks 6a, 6b, 6c may change in each exposure processes and also may change depending on the chip sizes. Therefore, the optical alignment systems need to be moved according to the changes of the positions of the alignment marks. The optical alignment systems 11a, 11b and 11c are arranged on moving bases 16a, 16b and 16c respectively. The bases can move in X-Y directions individually.

The X-ray exposure apparatus is used in the proximity exposure. All of the alignment marks 6a, 6b, 6c for detecting should be in the exposure area, which is generally sized 10 mm to 30 mm in the shape of a square. The optical alignment systems 11a, 11b, 11c should be arranged over the alignment marks 6a, 6b, 6c, respectively, and they should not interfere with each other in such a narrow space.

Therefore, the moving bases 16b and 16c, opposite each other, are arranged on the same plane. However, the moving base 16a is arranged above the moving base 16b and 16c as described in FIG. 2 and FIG. 3. Thus the position of the optical alignment system 11a installed on the moving base 16a is above the other optical alignment systems 11b, 11c.

As shown in FIG. 2 and FIG. 3, the distance $h_2$ from the optical axis of the optical alignment system 11b to the alignment mark 6b is equal to the distance $h_3$ from the optical axis of the optical alignment system 11c to the alignment mark 6c ($h_2 = h_3$). However, the distance $h_1$ from the optical axis of the optical alignment system 11a to the alignment mark 6a is bigger than the distance $h_2$ or the distance $h_3$ respectively ($h_1 > h_2$, $h_1 > h_3$).

When the optical alignment system 11a is not arranged in the same plane in which the optical alignment system 11b and 11c are arranged as described above, the focal length $f_1$ of the object lens 12a attached in the optical alignment system 11a is different from the focal lengths $f_2$ and $f_3$ of the object lenses 12b and 12c attached in the optical alignment system 11b and 11c respectively.

The focal length $f_2$ is equal to the sum of the length $h_2$ and the length $h_2'$ which is the distance from the center of the lens 12b to the alignment mark 6b. The case of the focal length $f_3$ is as same as $f_2$. On the other hand, the focal length $f_1$ is equal to the sum of the length $h_1$ and the length $h_1'$ which is the distance from the center of the lens 12a to the alignment mark 6a. The value of $f_1$ is not equal to the value of $f_2$ or $f_3$ respectively.

Therefore, the optical power of lenses are different from each other in these optical alignment systems and many different parts for producing the systems are needed. Also the production cost of these different systems is very high and production takes many processes. The width of X mark 6a, Y mark 6b and θ mark 6c are shown in FIG. 2 as c1, c2, and c3, respectively. The value of c1 is not equal to the value of c2 or the value of c3. The value c2 is equal to the value of c3 (c1≠c2=c3). Because the optical power of the lenses are different from others it is required to detect the marks as a same scaled picture with a data processing system.

SUMMARY OF THE INVENTION

Accordingly, it is an object of the present invention to provide a exposure apparatus which can be composed of common optical parts and protected from the interference of the optical alignment systems with each other in the same plane.

To accomplish the above described object, an exposure apparatus is provided which comprises:

a light source for exposing;

a mask holding means for alternately holding and releasing a mask;

a target holding means for alternately holding and releasing a target;

a moving means for moving the mask holding means and the target holding means individually; and, at least two alignment detecting means located in the same plane, the alignment detecting means including a moving base a narrow front portion.

BRIEF DESCRIPTION OF THE DRAWINGS

These and other objects and advantages of this invention will become more apparent and more readily appreciated from the following detailed description of the presently preferred exemplary embodiments of the invention taken in conjunction with the accompanying drawings wherein:

FIGS. 4a and 4b show the alignment marks of the embodiment according to the present invention of FIG. 4;

DESCRIPTION OF THE PREFERRED EMBODIMENTS

Figure 4:
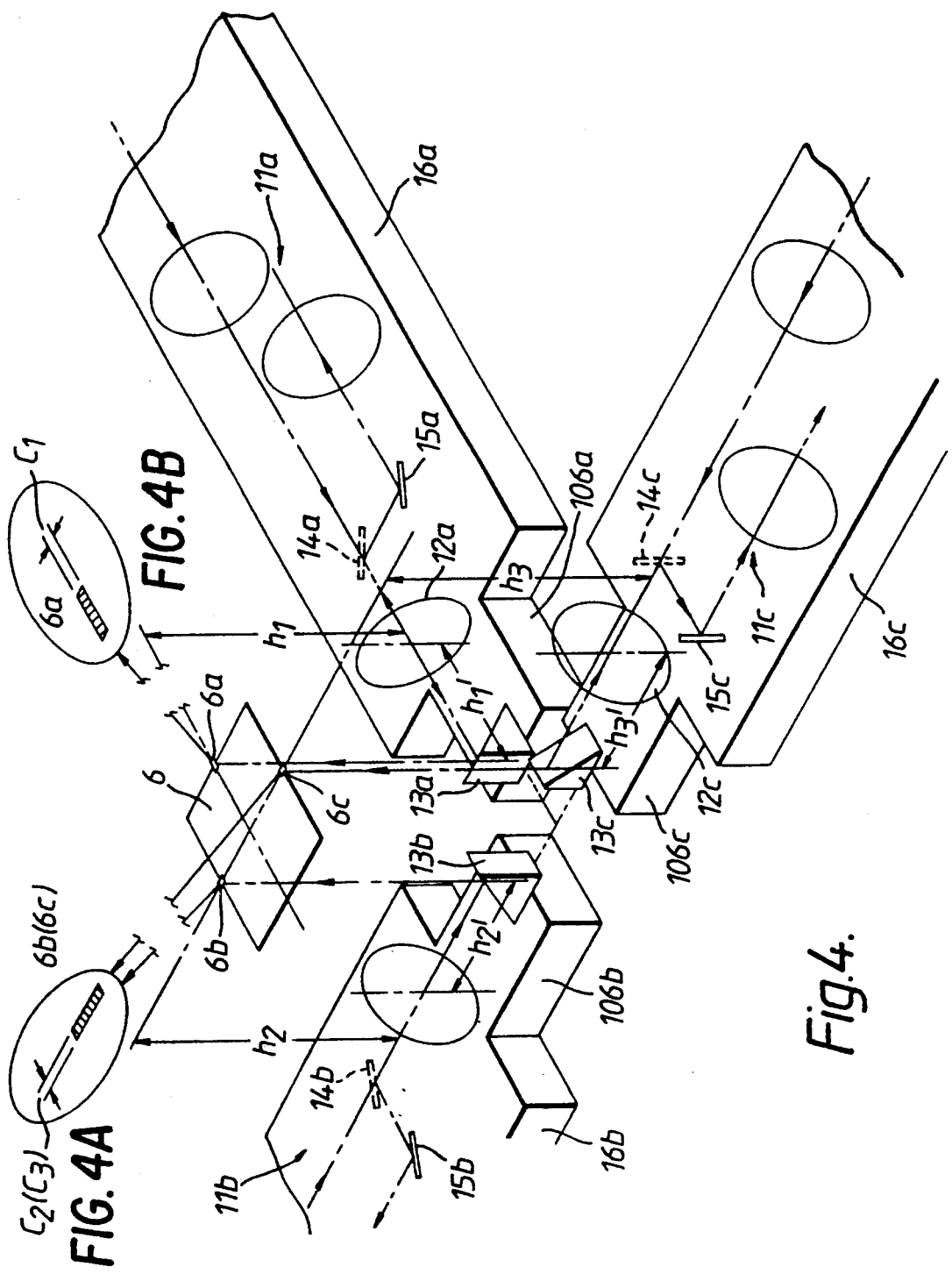
FIG. 4 shows a perspective top view of an embodiment according to the present invention.
Figure 5:
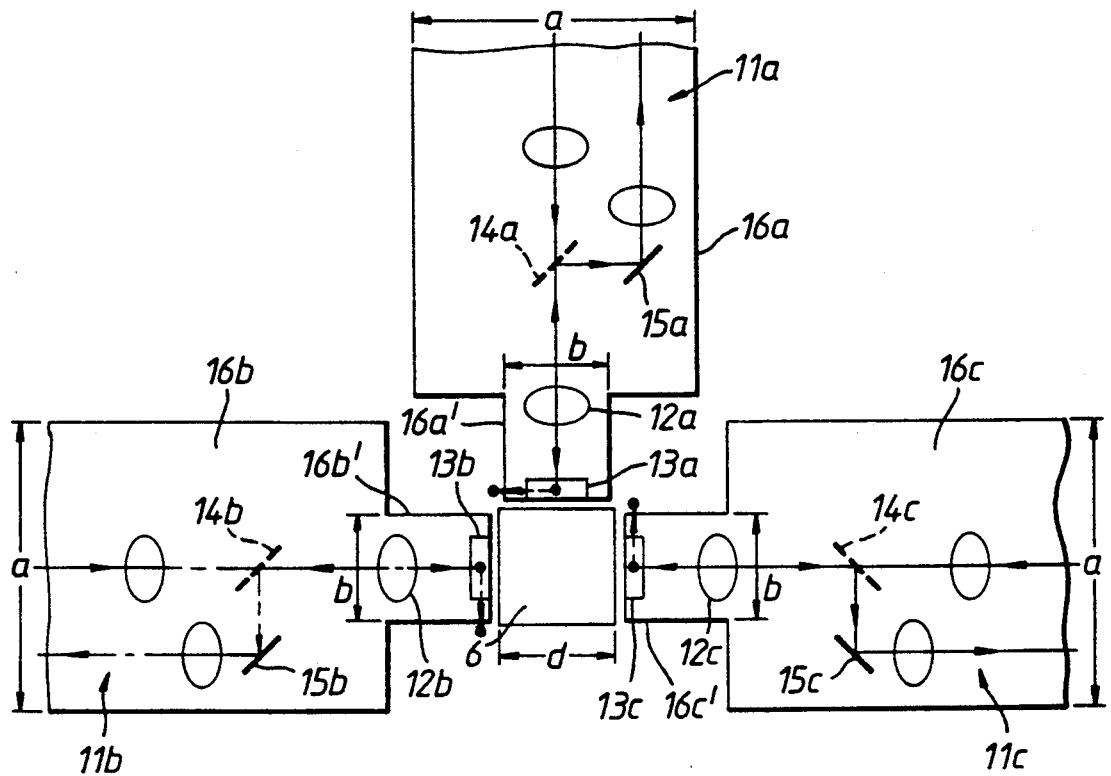
FIG. 5 and FIG. 6 show plan views of an embodiment according to the present invention.
Figure 6:
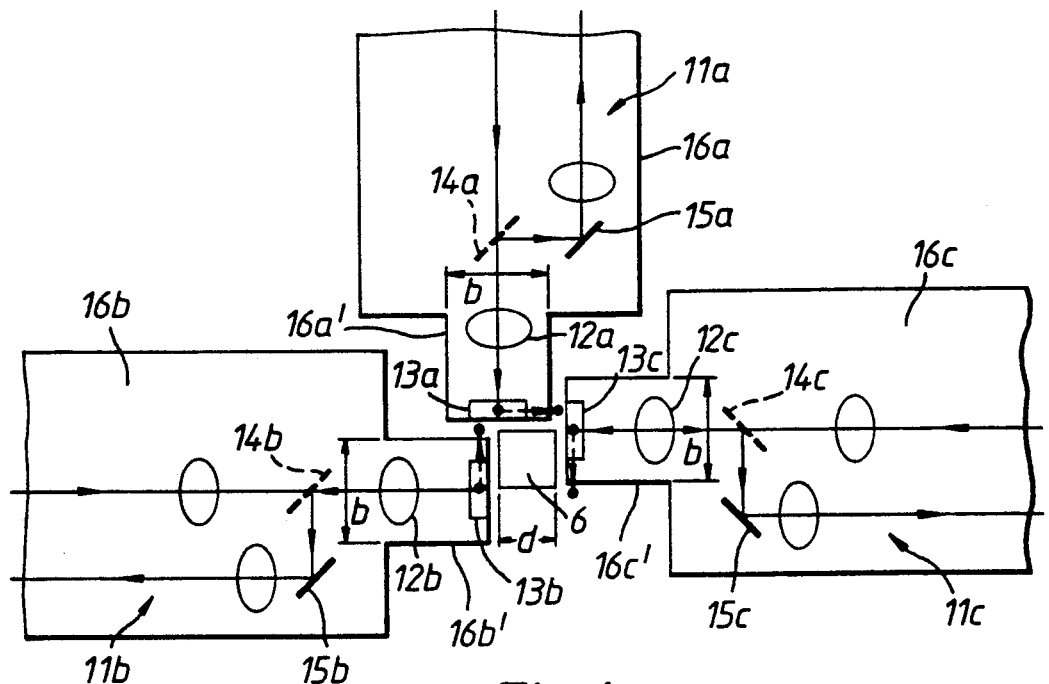

A structure of an embodiment according to the invention is show in FIG. 4 to FIG. 6.

Figure 1:
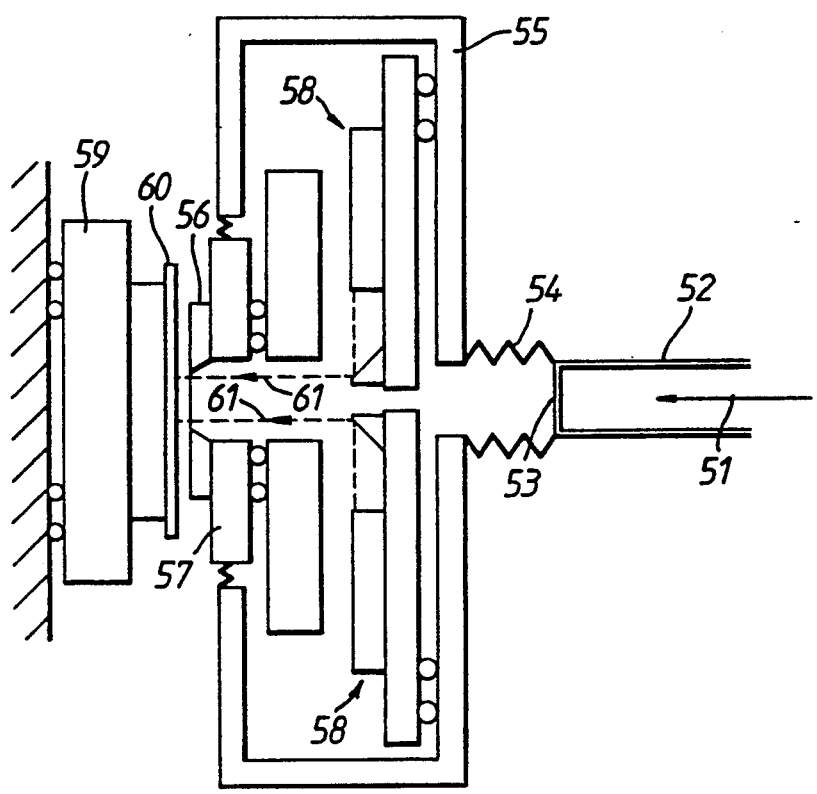
FIG. 1 shows a vertical sectional view of a structure of a conventional X-ray exposure apparatus.
Figure 2:
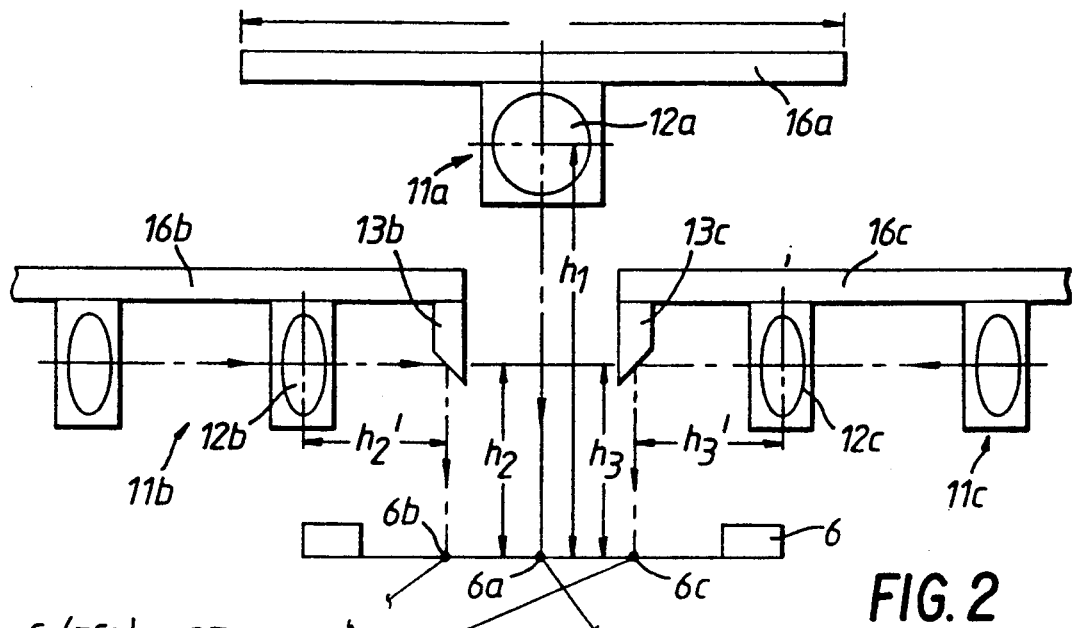
FIG. 2 shows a schematic front view of conventional optical alignment systems.
Figure 2A:
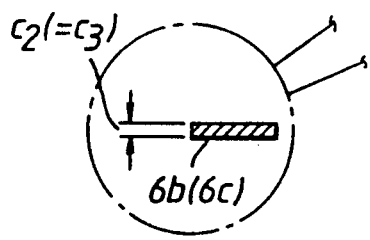
FIGS. 2a and 2b show the alignment marks of the optical alignment system of FIG. 2.
Figure 2B:
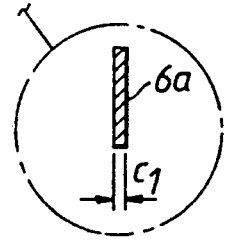
Figure 3:
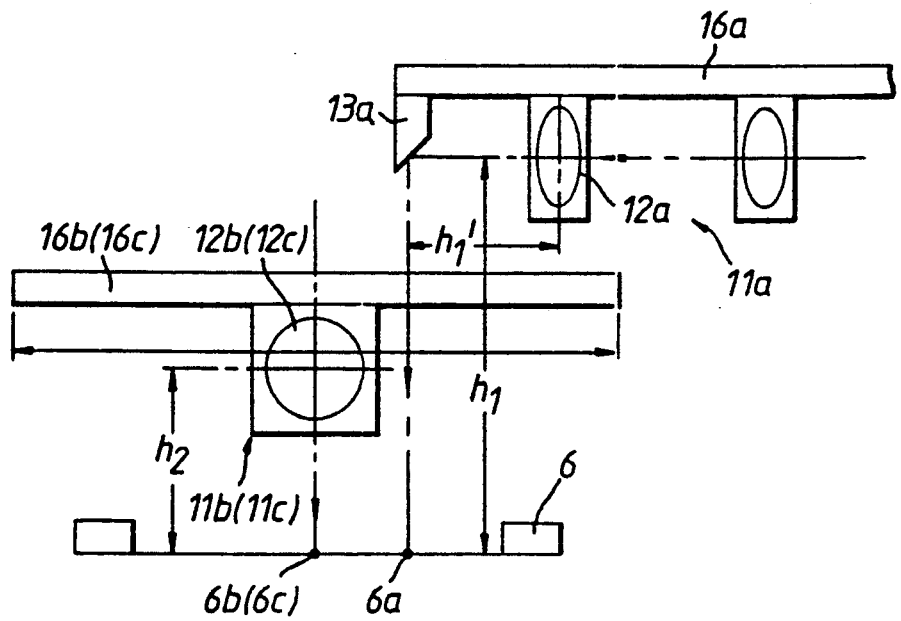
FIG. 3 shows a schematic side view of conventional optical alignment systems.

One of the different points as compared to the conventional apparatuses shown in FIG. 1 and FIG. 2 is that three moving bases are arranged in the same plane. These moving bases are the X position alignment system moving base 16a, the Y position alignment system moving base 16b and the θ position alignment system moving base 16c as shown in FIG. 4.

Three optical alignment systems, which are X position optical alignment system 11a, Y position optical alignment system 11b and θ position optical alignment system 11c are installed on the three bases 16a, 16b and 16c respectively. Therefore, these three optical alignment systems 11a, 11b and 11c are also arranged in the same plane. Common parts such as optical parts can be used in these systems. Three half-mirrors 14a, 14b and 14c, and three reflective mirrors 15a, 15b and 15c, are included in the three optical alignment systems 11a, 11b, and 11c, respectively, as shown in FIG. 4.

The distance $h_1$ is defined as a length between the optical axis of the optical alignment system 11a and the X-ray mask 6. The distance $h_2$ is defined as a length between the optical axis of the optical alignment system 11b and the X-ray mask 6. The distance $h_3$ is defined as a length between the optical axis of the optical alignment system 11c and the X-ray mask 6. These three distances $h_1$, $h_2$ and $h_3$ become equal to each other because of the arrangement of these three systems in the same plane.

The distance $h_1'$, $h_2'$ and $h_3'$ are also defined as lengths between the object lenses 12a, 12b and 12c, and the prisms 13a, 13b and 13c respectively. When the distances $h_1'$, $h_2'$ and $h_3'$ are made the same, the focal length $f_1$ (=$h_1+h_1'$) of the optical alignment system 11a, $f_2$ (=$h_2+h_2'$) of the optical alignment system 11b, and $f_3$ (=$h_3+h_3'$) of the optical alignment system 11c can be made the same value.

Therefore, the widths of the alignment marks 6a, 6b and 6c become the same C1=C2=C3) and the alignment detecting accuracies in the optical alignment systems 11a, 11b and 11c are made even with each other.

Three narrow portions 106a, 106b and 106c are shaped in front of the moving bases 16a, 16b and 16c respectively. In this embodiment, by cutting both sides of the base, the narrow front portion is rectangle-shaped (as shown in FIG. 4) and the maximum width "a" of the moving base is larger than the maximum width "b" of the narrow front portion as Shown in FIG. 5 and FIG. 6.

The moving bases 16a, 16b and 16c can move individually on the same plane without interferences with each other because of the narrow front portions as described above.

When the chip size of the X-ray mask 6 is d×d length and breadth, a method to search for the marks on the mask by use of the alignment system is described hereunder.

In the case of d≧b (d is already defined above and b is the width of the narrow front portion), the search for the marks starts from the center of the chip to the edge of the chip as shown in FIG. 5. In the case of d<b, the search for the marks starts from the edge of the chip as shown in FIG. 6.

When the bases move to search for the marks, an interlock mechanism is necessary to prevent the clashing of the moving bases against each other. A software control is generally used as the interlock mechanism. First a interlock map is made The map shows the lashing points of the three moving bases 16a, 16b and 16c each other. Next, the actual locations of the three bases are compared with the points on the map, and the moving bases are stopped before the bases clash against each other. Thus, the interference of the optical alignment system is prevented.

However, the software control has some problems. When the software control or a hardware control system including the software is broken, the moving bases may clash against each other. Under the software control, the X-Y positions of the moving bases always must be observed by the computer. This is one of the causes for increases in cost.

Figure 7:
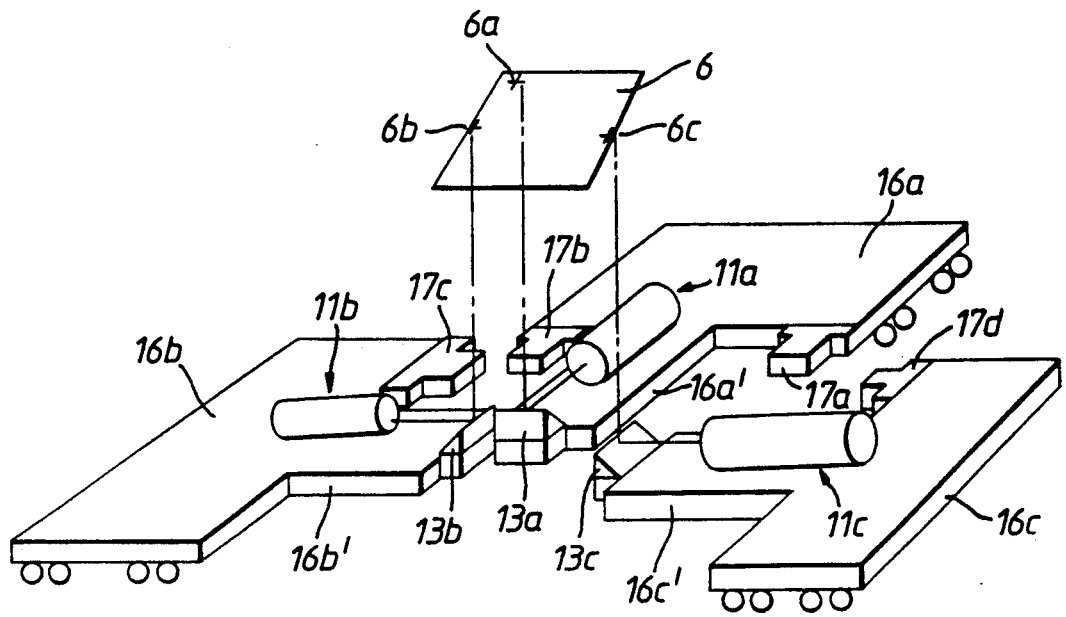
FIG. 7 shows a perspective top view of an external appearance of other embodiment according to the present invention.
Figure 8:
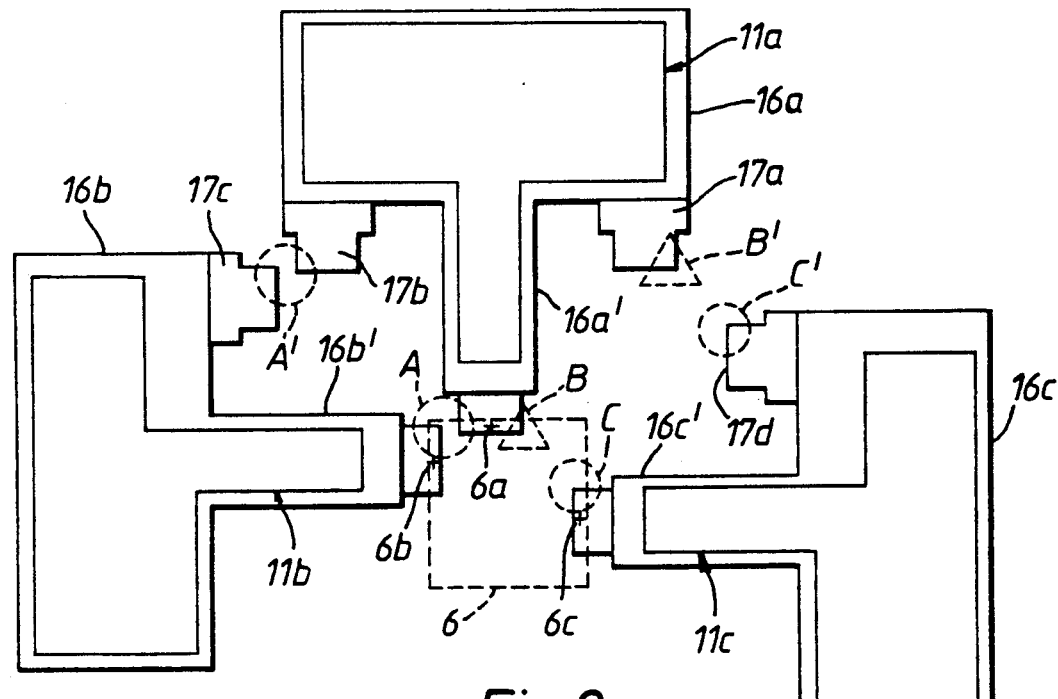
FIG. 8 shows a plane view of other embodiment according to the present invention.

Another preferred embodiment which doesn't have the problems as described above is shown in FIG. 7 and FIG. 8.

As shown in these Figures, X interference blocks 17a and 17b are attached at both sides of the notches in the moving base 16a. In a similar way, Y interference block 17c and θ interference block 17d are attached to moving bases 16b and 16c, respectively.

The size of these blocks 17a, 17b, 17c and 17d is slightly larger the size of the narrow front portions of the moving bases 11a, 11b and 11c, respectively. The shape of these blocks is the same as the narrow front portions of the moving bases (shown as A—A', B—B and C—C').

When the moving bases 16a, 16b and 16c on which the alignment systems 11a, 11b and 11c are installed move, the interference blocks 17a, 17b and 17d clash against each other before the optical alignment systems clash against each other, that is to say, the interference blocks work as a mechanical interlock.

Figure 9:
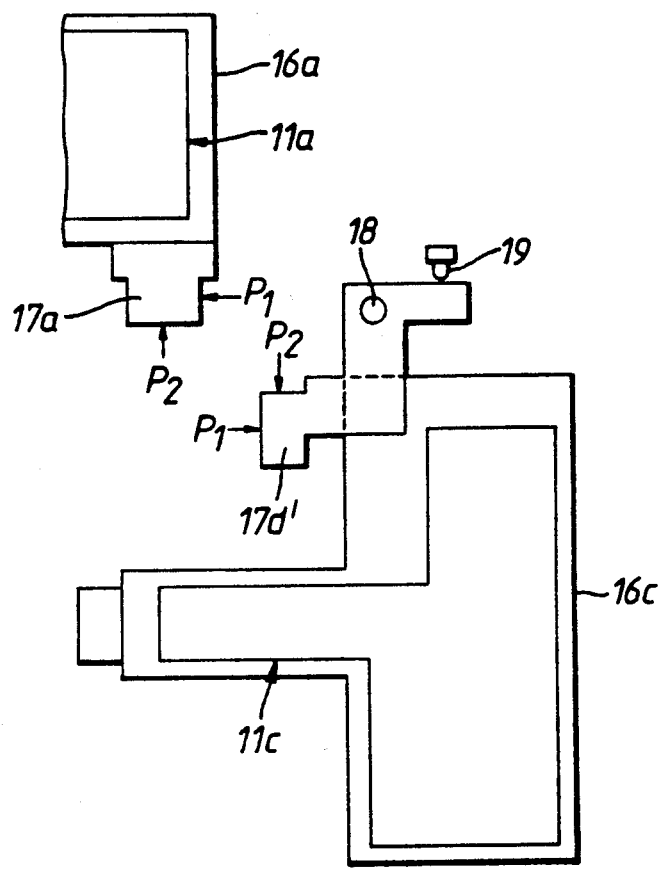
FIG. 9 shows a partial plan view of other embodiment according to the present invention.

Another mechanical interlock is shown in FIG. 9. In this case, interference block 17d' shaped as shown in FIG. 9 is attached on the moving base 16c. The block 17d' can rotated on a axis 18. When the interference block 17a clashes against the interference block 17d' at the P1 or P2 position of the block 17a and 17d', which depends on the movement of the moving base 16a and 16c, the rotatable block 17d' rotates and a sensor 19 detects the movement of the block 17d' and the bases 16a or 16c are stopped before the clashing between the moving base 16a and 16c occurs.

Figure 10:
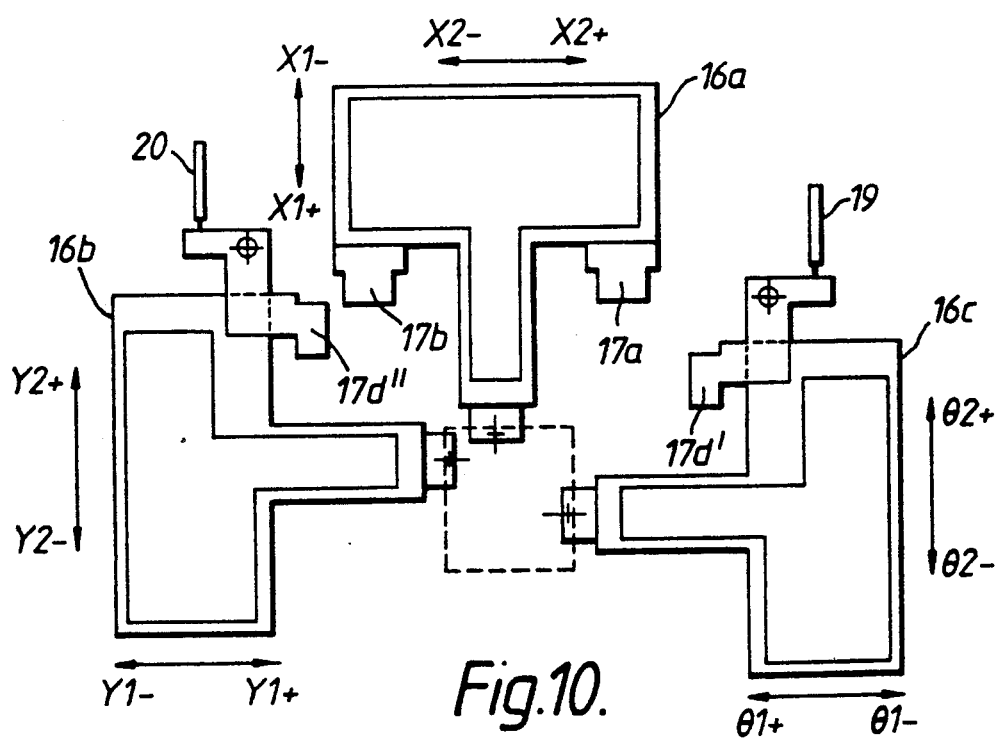
FIG. 10 shows a plan view of other embodiment according to the present invention.

Another preferred embodiment shown in FIG. 10 is described hereunder.

A interference block 17d" is attached to the moving base 16b. The interference block 17d" can also rotate on a axis. An interference block 17b is attached on the other side of the moving base 16a. A sensor 20 for detecting the clashing of the blocks is installed on the block 17d".

Moreover limit sensors (not shown) are installed on each moving base 16a, 16b and 16c. The moving base 16a has two limit sensor detecting in two directions individually. One direction is described as X1+-X1—, and the other is described as X2+-X2—. The moving base 16b has two limit sensors detecting in the directions as described in Y1+-Y1— and Y2+-Y2—. The moving base 16c also has two limit sensors detecting in the directions as described in θ1+-θ1— and θ2+-θ2—.

The moving bases cannot continue to move when the limit sensor signal is received. However, the moving base can move in the direction required to switch off the limit sensor. The limit sensor restricts the area in which each moving base can move around by electric mechanisms.

The movement of this system as described above is as follows.

Figure 11:
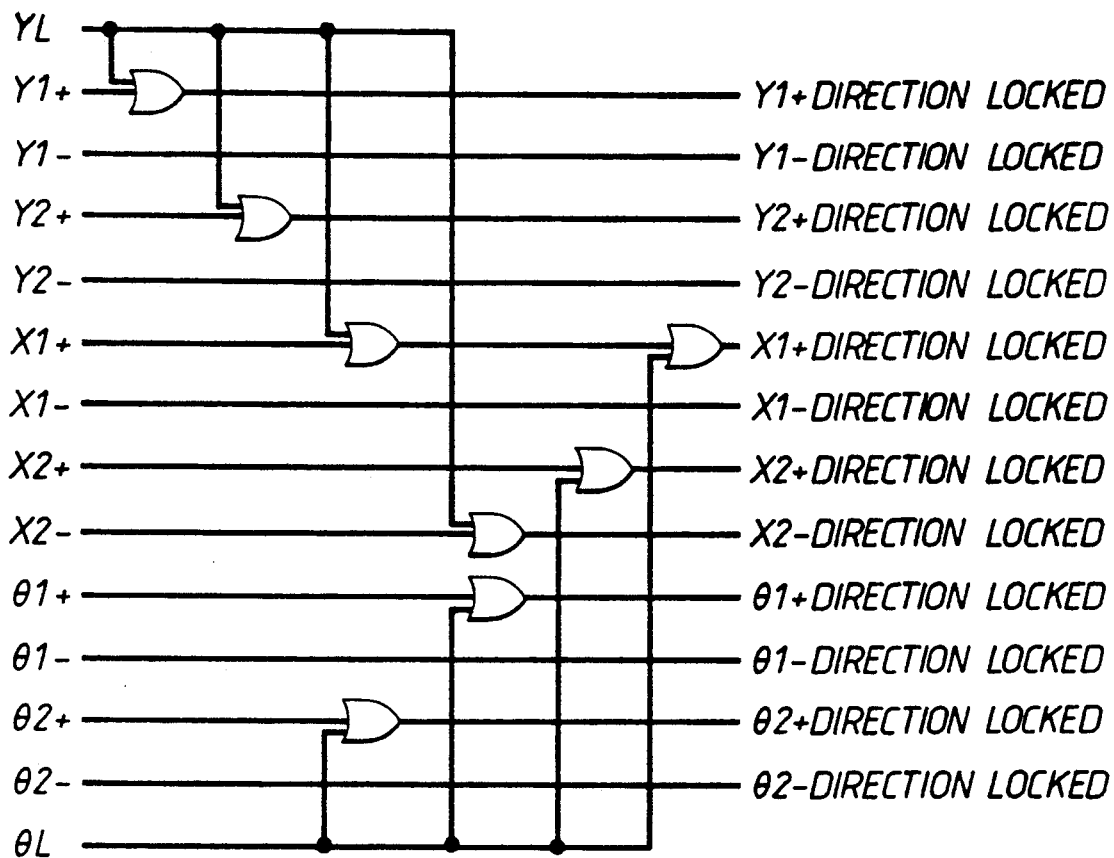
FIG. 11 shows a signal flow chart of the present invention shown in FIG. 10.

In FIG. 11, the input signals from the limit sensors or the sensors 19, 20 are described in the left line, on the other hand the output signals to stop the movements of the bases are described in the right line. For example, when a signal of the YL from the sensor 20 is put on, movement in the directions of Y1+, Y2+, X1+ and X2— is locked as shown in FIG. 11 and the clashing between the moving base 16a and 16b is prevented. The movement in the direction of X1+ is locked when at least an input signal X1+ or θL (from the sensor 19) is put on.

The present invention has been described with respect to specific embodiments. However, other embodiments based on the principles of the present invention should be obvious to those of ordinary skill in the art Such embodiments are intended to be covered by the claims.

What is claimed is:

1. An exposure apparatus comprising:
    a mask holder having means to move a mask held thereon;
    a target holder having means to move a target held thereon;
    an alignment system including at least two bases each being linearly movable along an axis parallel to the mask, wherein each base has an interference block and a front portion that is narrower than a rear portion of that base, and wherein each base carries an alignment sub-system or viewing an alignment mark on the mask to enable the mask holder and target holder to be steered to a proximal exposure position, characterized in that all axes intersect at one point and lie in one plane, each interference block has a blocking part which can be hit by another blocking part, a size of each blocking part is larger than a size of one of the narrower front portions corresponding to that blocking part, a shape of each blocking part is the same as the narrower front portion corresponding to that blocking part, and a direction of each blocking part is the same as one of the narrower front portions so that each base can engage with another base or another interference block to prevent collision of the alignment sub-systems.

2. The exposure apparatus according to claim 1, wherein at least one of the interference blocks is displaceably mounted on one of the bases, a sensor is arranged to detect displacement of the interference blocks, and a means for stopping movement of the bases in response to the sensor is provided.

3. The exposure apparatus according to claim 2, wherein the sensor is arranged to detect displacement of at least one of the interference blocks in two directions.

4. The exposure apparatus according to claim 2, wherein the means for stopping movement of the bases allows at least one of the bases to move in a direction different than the direction which causes the sensor to be actuated.

5. The exposure apparatus according to any of the preceding claims, wherein each alignment sub-system is an optical assembly.

6. The exposure apparatus according to claim 5, wherein each optical assembly includes a prism.

7. The exposure apparatus according to claim 1, wherein movement of each base is detected by a sensing means.

8. The exposure apparatus according to claim 2, further comprising a limit sensor for detecting movement of at least one of the bases and for generating a movement signal, and means for receiving the signal from the limit sensor and generating an output signal to control the movement of the at least one base.

9. An exposure apparatus comprising:
a light source;
mask holding means for holding a mask;
target holding means for holding a target in optical alignment with the light source and the mask; and
an alignment system comprising a plurality of movable bases, wherein:
  each base comprises a front portion and a rear portion and is shaped such that the front portion is narrower than the rear portion;
  each base comprises an interference block and supports an alignment sub-system for aligning the mask holding means and the target holding means at an exposure position;
  each interference block has a shape that is the same as the shape of at least one of the bases; and
  each interference block of each base extends from that base to prevent collision of the alignment sub-systems.

10. The exposure apparatus of claim 9, wherein at least one of the interference blocks is rotatably mounted on one of the bases and the exposure apparatus comprises means for detecting displacement of each rotatable interference block and means for stopping movement of the bases in response to the detecting means.

11. The exposure apparatus according to claim 10, wherein each detecting means detects displacement of one of the rotatable interference blocks in a plurality of directions.

12. An exposure apparatus according to claim 9, wherein each alignment sub-system is an optical assembly.

13. An exposure apparatus according to claim 12, wherein each optical assembly includes a prism.

* * * * *